United States Patent
Guillemette

(10) Patent No.: US 9,831,895 B2
(45) Date of Patent: Nov. 28, 2017

(54) SYSTEM AND METHOD FOR A MESSAGE PASSING ALGORITHM

(71) Applicant: Huawei Technologies Co., Ltd., Shenzhen (CN)

(72) Inventor: Philippe Guillemette, Stittsville (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 44 days.

(21) Appl. No.: 14/997,297

(22) Filed: Jan. 15, 2016

(65) Prior Publication Data

US 2016/0211867 A1    Jul. 21, 2016

Related U.S. Application Data

(60) Provisional application No. 62/103,926, filed on Jan. 15, 2015.

(51) Int. Cl.
| | |
|---|---|
| *H03M 13/11* | (2006.01) |
| *H04L 1/00* | (2006.01) |
| *H03M 13/15* | (2006.01) |
| *H03M 13/23* | (2006.01) |

(52) U.S. Cl.
CPC .... *H03M 13/1114* (2013.01); *H03M 13/1111* (2013.01); *H03M 13/1102* (2013.01); *H03M 13/152* (2013.01); *H03M 13/1505* (2013.01); *H03M 13/23* (2013.01); *H04L 1/0048* (2013.01); *H04L 1/0057* (2013.01)

(58) Field of Classification Search
CPC .......... H03M 13/1114; H03M 13/1111; H03M 13/1102; H03M 13/1505; H03M 13/152; H03M 13/23; H04L 1/0048
See application file for complete search history.

(56) References Cited

U.S. PATENT DOCUMENTS

| | | | |
|---|---|---|---|
| 7,405,678 B2 * | 7/2008 | Cherubini | H03M 7/46 341/50 |
| 7,680,201 B2 * | 3/2010 | Kroeger | H04B 1/406 375/260 |

(Continued)

OTHER PUBLICATIONS

Eslami, A., et al., "A Practical Approach to Polar Codes," IEEE International Symposium on Information Theory Proceedings (ISIT), Jul. 31, 2011-Aug. 5, 2011, pp. 16-20.

(Continued)

*Primary Examiner* — Esaw Abraham
(74) *Attorney, Agent, or Firm* — Slater Matsil, LLP

(57) ABSTRACT

The complexity of sparse code multiple access (SCMA) decoding can be reduced by pruning codebooks to remove unlikely codewords prior to, or while, performing an iterative message passing algorithm (MPA). The pruned codebook is then used by to perform one or more iterations of MPA processing, thereby reducing the number codeword probabilities that are calculated for the corresponding SCMA layer. The pruned codebook also reduces the computational complexity of calculating codeword probabilities associated with other SCMA layers. The pruned codebook may be "reset" by reinserting the pruned codewords into the codebook after a final hard-decision for a given set of received samples is made, so that the pruning does not affect evaluation of the next set of samples.

20 Claims, 10 Drawing Sheets

(56) References Cited

U.S. PATENT DOCUMENTS

| | | | | |
|---|---|---|---|---|
| 7,747,934 B2* | 6/2010 | Livshitz | ............ | H03M 13/1111 |
| | | | | 714/800 |
| 7,996,746 B2* | 8/2011 | Livshitz | ............ | H03M 13/1111 |
| | | | | 714/752 |
| 8,060,803 B2* | 11/2011 | Kim | ................ | H03M 13/1148 |
| | | | | 375/340 |
| 8,230,294 B2* | 7/2012 | Roberts | ............ | H03M 13/1114 |
| | | | | 714/751 |
| 8,392,789 B2* | 3/2013 | Biscondi | ........... | H03M 13/1114 |
| | | | | 375/262 |
| 8,650,459 B1* | 2/2014 | Lee | ...................... | H04L 1/0054 |
| | | | | 714/759 |
| 8,683,292 B2* | 3/2014 | Lee | ................... | H03M 13/1117 |
| | | | | 714/751 |
| 8,792,594 B2* | 7/2014 | Vojcic | ................... | H04L 1/005 |
| | | | | 375/233 |
| 9,077,377 B2* | 7/2015 | Okamura | .......... | H03M 13/1117 |
| 9,240,853 B2* | 1/2016 | Nikopour | ............... | H04J 13/00 |
| 2006/0013181 A1 | 1/2006 | Stolpman et al. | | |
| 2007/0179760 A1 | 8/2007 | Smith | | |
| 2009/0132894 A1 | 5/2009 | Xu et al. | | |
| 2013/0343496 A1 | 12/2013 | Eliaz et al. | | |
| 2014/0140360 A1 | 5/2014 | Nikopour et al. | | |
| 2014/0169408 A1 | 6/2014 | Bayesteh et al. | | |
| 2014/0269663 A1 | 9/2014 | Nikopour et al. | | |
| 2014/0369434 A1 | 12/2014 | Taherzadehboroujeni et al. | | |

OTHER PUBLICATIONS

Bertrand, E., "Simplified Trellis Decoding of Block Codes by Selective Pruning." Feb. 2005, Retrieved from <http://www-mmsp.ece,mcgill.ca/mmsp/theses/2005/bertrandt2005.pdf>, 80 pages.

Um, H., et al., "Selective Video Encryption of a Distributed Coded Bitstream Using LDPC Codes." In: Security, Steganography, and Watermarking of Multimedia Contents VIII. Feb. 17, 2006. Retrieved from <http://citeseerx.ist.psu.edu/viewdoc/download?doi=10.1.1,159.581&rep=rep1&type=pdf>, 12 pages.

* cited by examiner

SYSTEM AND METHOD FOR A MESSAGE PASSING ALGORITHM

This application claims the benefit of U.S. Provisional Application Ser. No. 62/103,926 filed on Jan. 15, 2015, and entitled "System and Method for Inner MPA Decoding Complexity Reduction Using Knowledge of Frozen Bits in Outer Polar Code," which application is hereby incorporated herein by reference.

TECHNICAL FIELD

The present invention relates to a system and method for network and wireless communications, and, in particular, to a system and method for a message passing algorithm.

BACKGROUND

Frequency domain non-orthogonal multiple-access techniques may achieve better spectral efficiency than comparable orthogonal multiple-access techniques by virtue of using the same resource to carry portions of two or more different data streams. However, this enhanced throughput generally comes at the expense of increased signal processing complexity at the receiver. In particular, a receiver may need to iteratively process a received signal to compensate for interference between non-orthogonal transmissions in the received signal, which may consume significant amounts of processing resources, as well as introduce latency into the decoding process. Accordingly, techniques for reducing the processing complexity of iterative non-orthogonal signal processing techniques are desired to improve decoding performance.

SUMMARY OF THE INVENTION

Technical advantages are generally achieved, by embodiments of this disclosure which describe system and method for a message passing algorithm.

In accordance with an embodiment, a method for decoding wireless signals is provided. In this example, the method includes receiving, at a Message Passing Algorithm (WA) processor, a sequence of samples representative of a received signal from a device, receiving, or otherwise generating, one or more probabilities associated codewords of a codebook assigned to a data stream in the received signal, and removing, in accordance with the probabilities, at least one of the codewords from the codebook to obtain a pruned codebook. The pruned codebooks exclude the at least one codeword. The method further includes processing the received sequence of samples according to the pruned codebook to generate soft decision values corresponding to the received signal, and sending the soft decision values to a forward error correction (FEC) decoder. An apparatus and computer program product for performing this method are also provided.

DETAILED DESCRIPTION OF ILLUSTRATIVE EMBODIMENTS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
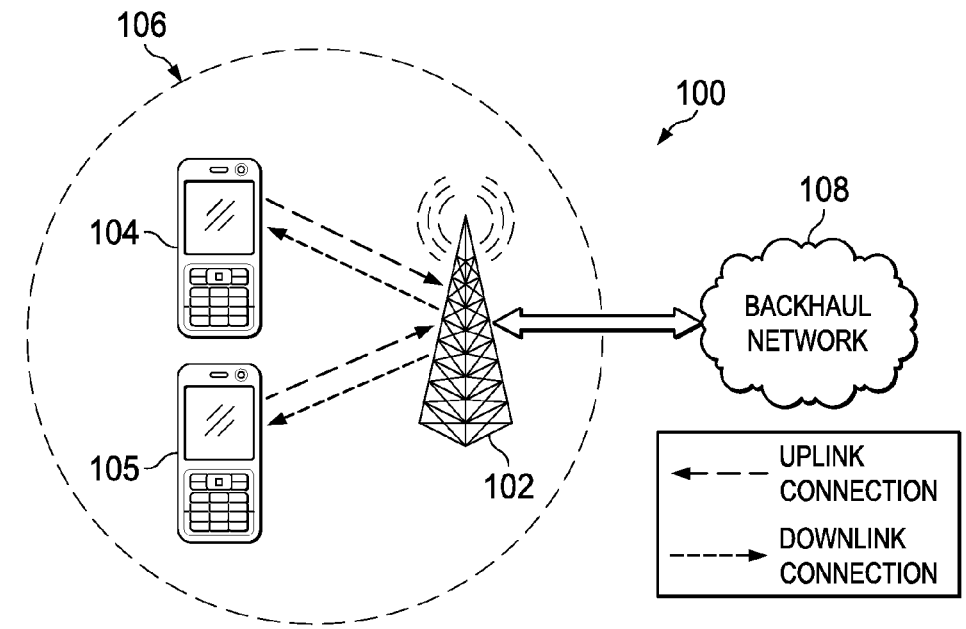
FIG. 1 illustrates a diagram of a wireless network for communicating data.

It should be understood at the outset that although an illustrative implementation of one or more embodiments are provided below, the disclosed systems and/or methods may be implemented using any number of techniques, whether currently known or not. The disclosure should in no way be limited to the illustrative implementations, drawings, and techniques illustrated below, including the exemplary designs and implementations illustrated and described herein, but may be modified within the scope of the appended claims along with their full scope of equivalents.

Sparse code multiple access (SCMA) is a non-orthogonal multiple-access technique that transmits multiple data streams over a set of sub-carrier frequencies using non-orthogonal spreading sequences. In particular, the data streams are communicated over different SCMA layers by mapping the data streams to the set of sub-carriers using SCMA codewords (e.g., a spreading sequence) selected from codebooks assigned to the respective SCMA layers. Each SCMA layer is mapped to a different combination of sub-carrier frequencies in the set of sub-carrier frequencies over which the data streams are collectively transmitted. SCMA codewords in a given codebook specify that different combinations of symbols are communicated over the combination of sub-carrier frequencies mapped to the corresponding SCMA layer. Thus, the codeword is selected based on the bit-encoding of the data stream.

The relative sparsity of SCMA codewords allow the data streams in a received signal to be distinguished from one another, and ultimately decoded, using an iterative message passing algorithm (MPA). In particular, an MPA processor evaluates the received signal carrying data streams over a series of iterations. During each iteration, the MPA processor computes codeword probabilities for all codewords in each codebook assigned to the SCMA layers. Each of the codeword probabilities corresponds to a likelihood that a particular codeword in the codebook was transmitted over the corresponding SCMA layer. The codeword probabilities associated with one SCMA layer are calculated, in part, based on the codeword probabilities for other SCMA layers. As a result, improving the accuracy of codeword probabilities for one layer during a given iteration improves the accuracy of codeword probabilities for other layers during a subsequent iteration. In this way, the MPA processor is able to iteratively refine the probabilities during each successive iteration until a stop condition is reached, at which point the MPA processor uses the codeword probabilities to calculate log likelihood ratios (LLRs) for bits mapped to the most-probable codeword. The LLRs are then sent to a forward error correction (FEC) decoder, which uses the LLRs to make hard decisions during bit-level decoding.

Because codeword probabilities are generally computed for all codewords in a codebook during each iteration of MPA processing, the computational complexity associated with SCMA decoding is heavily influenced by the number of codewords in the corresponding codebooks. The number of codewords in a codebook is largely determined by size of the constellation used to modulate the symbols. As a result, SCMA decoding complexity may be significantly increased when larger constellation sizes are used to achieve higher data rates. Accordingly, techniques for reducing the complexity of SCMA decoding are desired.

Aspects of this disclosure reduce the complexity of SCMA decoding by pruning codebooks to remove unlikely codewords. The pruned codebook is then used by the MPA processor to perform one or more iterations of MPA processing, thereby reducing the number codeword probabilities that are calculated for the corresponding SCMA layer. The pruned codebook also reduces the computational complexity of calculating codeword probabilities associated with other SCMA layers. In particular, an MPA processor may typically use codeword probabilities of SCMA layers that are non-orthogonal to a given SCMA layer as an input parameter when computing codeword probabilities for the given SCMA layer. Hence, pruning codewords from codebooks associated with one SCMA layer may reduce the number of interfering codeword probabilities that are taken into consideration when computing codeword probabilities for another SCMA layer. It should be appreciated that the pruned codebook may be "reset" (e.g., the pruned codewords may be re-inserted) after a final hard-decision for a given set of received samples is made, so that the pruning does not affect evaluation of the next set of samples (e.g., the next set of symbols in a subsequent time-slot).

Various techniques are provided for determining which codewords to prune from a given codebook. For example, codebooks may be pruned based on codeword probabilities or a priori probability (APP) values corresponding to codewords in the codebook. In one embodiment, an MPA processor prunes a codeword from a codebook when a codeword probability or an APP value associated with the codeword is less than a threshold. APP values are computed based on LLRs to further improve the decoding accuracy. In particular, LLRs are generated during an initial set of iterative computations by an MPA processor. The LLRs from an MPA processor are an input to a FEC decoder that produces a second set of LLRs. The FEC decoder's LLRs are then fed-back to an APP processor via an outer feedback loop, where they are used to compute APP values. The APP values specify likelihoods that SCMA codewords were communicated over a given layer, and are themselves fed-back to the MPA processor, where they are effectively used by the MPA processor as a starting point for computing codeword probabilities during a subsequent round of MPA iterations. In this way, codeword probabilities are iteratively computed based on received signal samples and, during later iterations, APP values in an inner feedback loop. When an inner feedback loop stop condition occurs, the codeword probabilities are used to compute LLRs, which are used to compute APP values in an outer feedback loop. Similar to the inner feedback loop, the APP values become further refined (e.g., more accurate) during each successive iteration of the outer feedback loop, thereby increasing the accuracy and/or convergence times of both the codeword probabilities generated during the inner feedback loop and the LLRs computed from the more accurate codeword probabilities.

As another example, codebooks may be pruned based on LLRs corresponding to bit values mapped to codewords in the codebooks. A set of LLRs for a given bit typically include a sign bit indicating a binary value of the bit (e.g., a one or a zero) and a set of magnitude bits indicating a confidence level of the sign bit. In an embodiment, an MPA processor removes a codeword from a codebook when an LLR indicates a different binary value than that mapped to the codeword and has a magnitude that exceeds a threshold. The LLR sign bit indicates a different binary value than the codeword when the LLR sign bit indicates a 1 and the codeword maps to 0, or vice versa. When LLR sign bit indicates a different binary value than the codeword, and the LLR magnitude exceeds the threshold, it may logically follow that the codeword itself is unlikely to have been transmitted at the corresponding layer. The threshold used to determine whether a codeword probability, an APP value, or an LLR magnitude warrants pruning may be predefined. For example, a codeword may be removed from a codebook once it is determined that there is at least a certain probability (e.g., ninety percent chance) that the codeword was transmitted in the data stream for a given period. The threshold may also be dynamically defined based on the values of other codeword probabilities, APP values, or LLRs associated with the codeword, codebook, layer, or received signal. These and other aspects are discussed in greater detail below. It should be noted that although reference is made here to decoding and pruning operations on binary values, in a transmission scheme that makes use of higher order representations of number (e.g. ternary or higher systems) may be used. Where reference is made to halving the number of codewords by fixing a bit value based on an LLR, it should be understood that in a non-binary system the reduction in codewords in the codebook will be less than 50%.

Codeword probabilities, APP values, and LLRs are referred to collectively as "probabilities" throughout this disclosure. Although codeword probabilities and the APP values both correspond to likelihoods that a given codeword was transmitted over a given layer, it should be appreciated that codeword probabilities are generated by the MPA processor during an inner-feedback loop based on, amongst other things, samples of the received signal, while APP values are computed by the MPA processor based on LLRs. Hence, codeword probabilities and APP values are computed by different entities using different techniques (e.g., different objective functions) based on different input information FIG. 1 illustrates a schematic representation of a network 100 for communicating data. Network 100 includes communications controller 102 having a coverage area 106, a plurality of user equipments (UEs), including UE 104 and UE 105, and backhaul network 108. Two UEs are depicted, but many more may be present. Communications controller 102 may be any component (or collection of components) capable of providing wireless access by establishing uplink (dashed line) and/or downlink (dotted line) connections with UE 104 and UE 105, such as a base station, a NodeB, an enhanced nodeB (eNB), an access point, a picocell, a femtocell, relay node, and other wirelessly enabled devices. It will be understood that in some embodiments, a first controller 102 may be responsible for uplink communication with a UE, while a second controller is responsible for downlink communication with the same UE. UE 104 and UE 105 may be any component capable of establishing a wireless connection with communications controller 102, such as cell phones, smart phones, tablets, sensors, etc. UE 104 and UE 105 are representative of a mobile device that can connect to the mobile network that controller 102 belongs to. The term mobile device will be understood to refer to a device that connects to a mobile network, and is not restricted to devices that are themselves mobile. Backhaul network 108 may be any component or collection of components that allow data to be exchanged between communications controller 102 and a remote end. In some embodiments, the network 100 may include various other wireless devices, such as relays, etc. Network 100 may use encoding and decoding, for example using turbo codes such as turbo codes, or polar codes.

Figure 2:
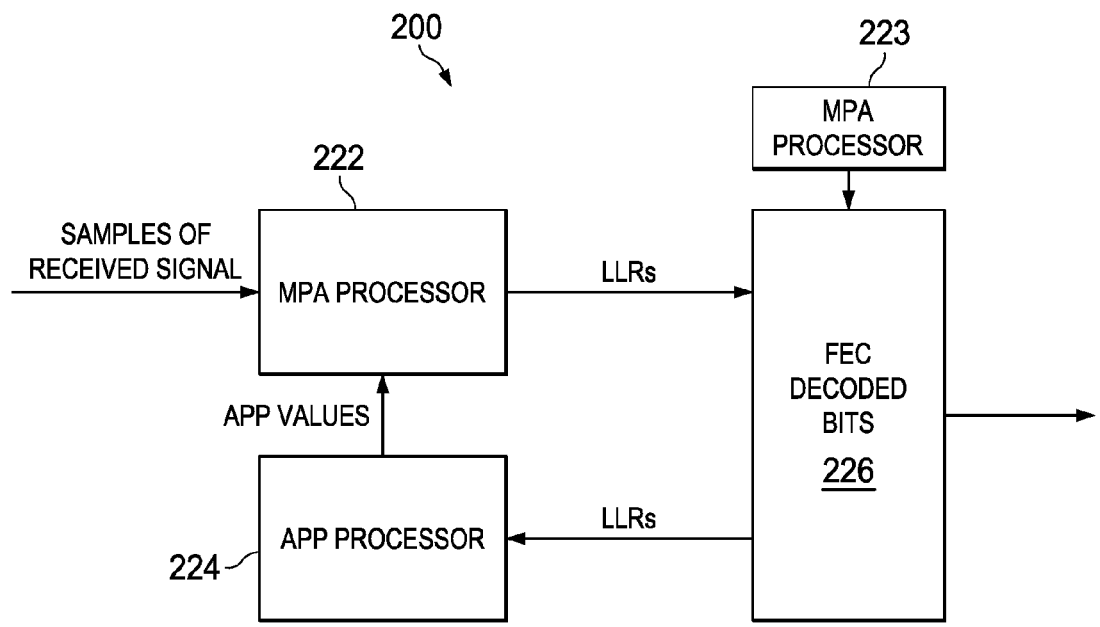
FIG. 2 illustrate a diagram of an embodiment SCMA decoder.

SCMA decoders may include MPA processors to perform symbol level decoding, and an FEC decoder to perform bit-level decoding. Some SCMA decoders may further include an APP processor to improve the accuracy of the symbol level decoding. FIG. 2 illustrates an embodiment SCMA decoder 200 for decoding received signals carrying SCMA data streams. As shown, the embodiment SCMA decoder 200 includes an MPA processor 222, an APP processor 224, and an FEC decoder 226. The MPA processor 222 may include any component, or collection of components, configured to perform iterative MPA processing on samples of a received signal to compute LLRs. The FEC decoder 226 may include any component, or collection of components, configured to perform bit-level decoding on the LLRs to obtain decoded bits. The APP processor 224 may include any component, or collection of components, configured to predict APP values based on the LLRs.

As mentioned above, the MPA processor 222 performs an initial round of iterative MPA processing on the received signal samples to generate codeword probabilities. Once a condition is reached, the MPA processor 222 computes LLRs based on the codeword probabilities, and then sends the LLRs to the FEC decoder 226. The FEC decoder may receive input from a plurality of different MPA processors assigned different related sequences. The FEC decoder 226 uses the received LLRs as an input and may perform further processing. The FEC decoder 226 outputs a set of LLRs that are then fed back to the APP processor 224, which computes APP values based on the LLRs. The APP values are then fed-back to the MPA processor 222, which uses the APP values as an input parameter during a subsequent round of iterative MPA processing.

The iterative generation of the codeword probabilities by the MPA processor 222 generally entails exchanging messages that include the codewords probabilities between different nodes of the MPA processor. In this way, the exchanging of messages between nodes of the MPA processor 222 forms an inner-feedback loop, while the exchanging of LLRs and APP values between the MPA processor 222, the FEC decoder 226, and the APP processor 224 forms the outer feedback loop.

Figure 3:
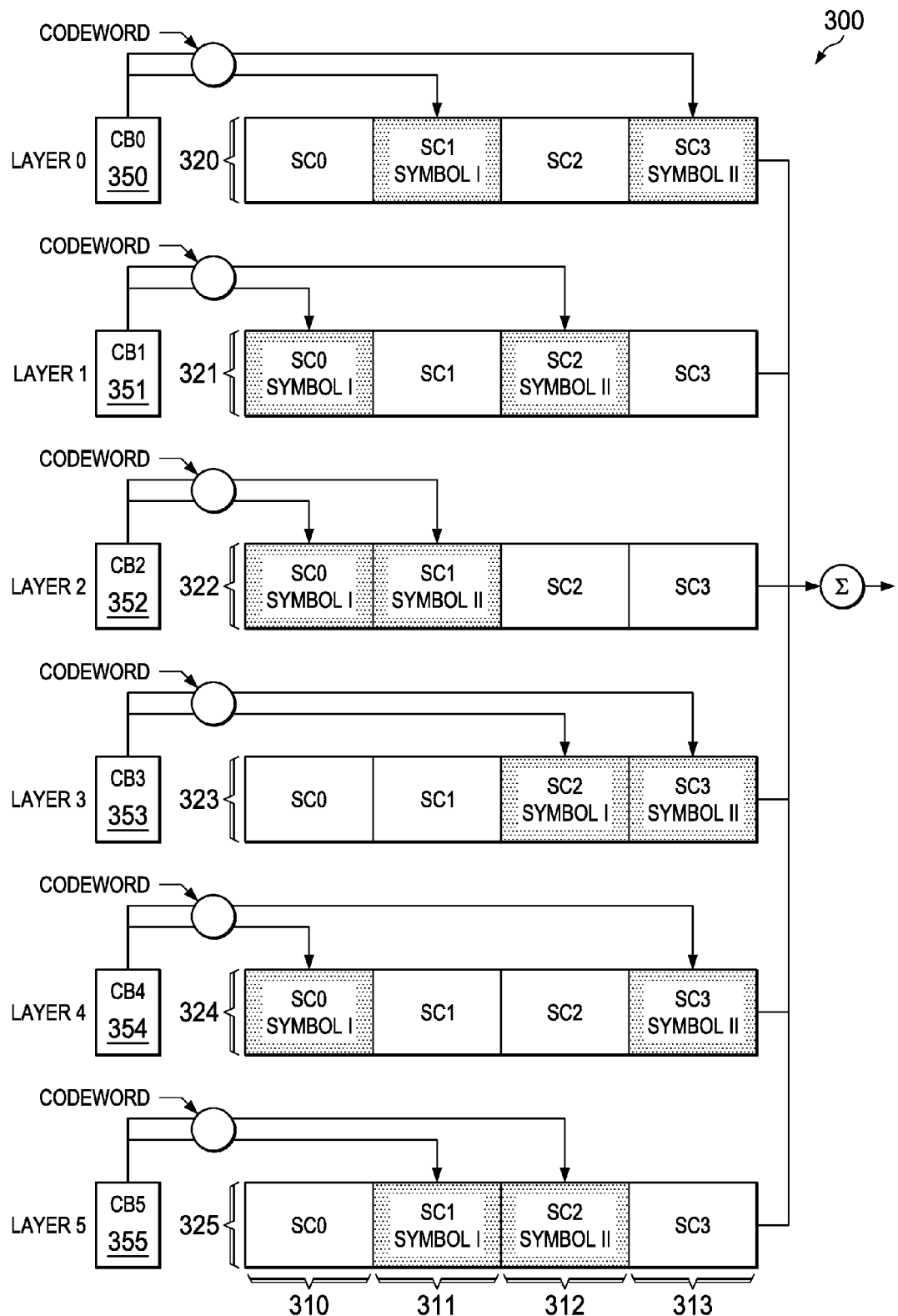
FIG. 3 illustrate a diagram of an example SCMA
Figure 4:
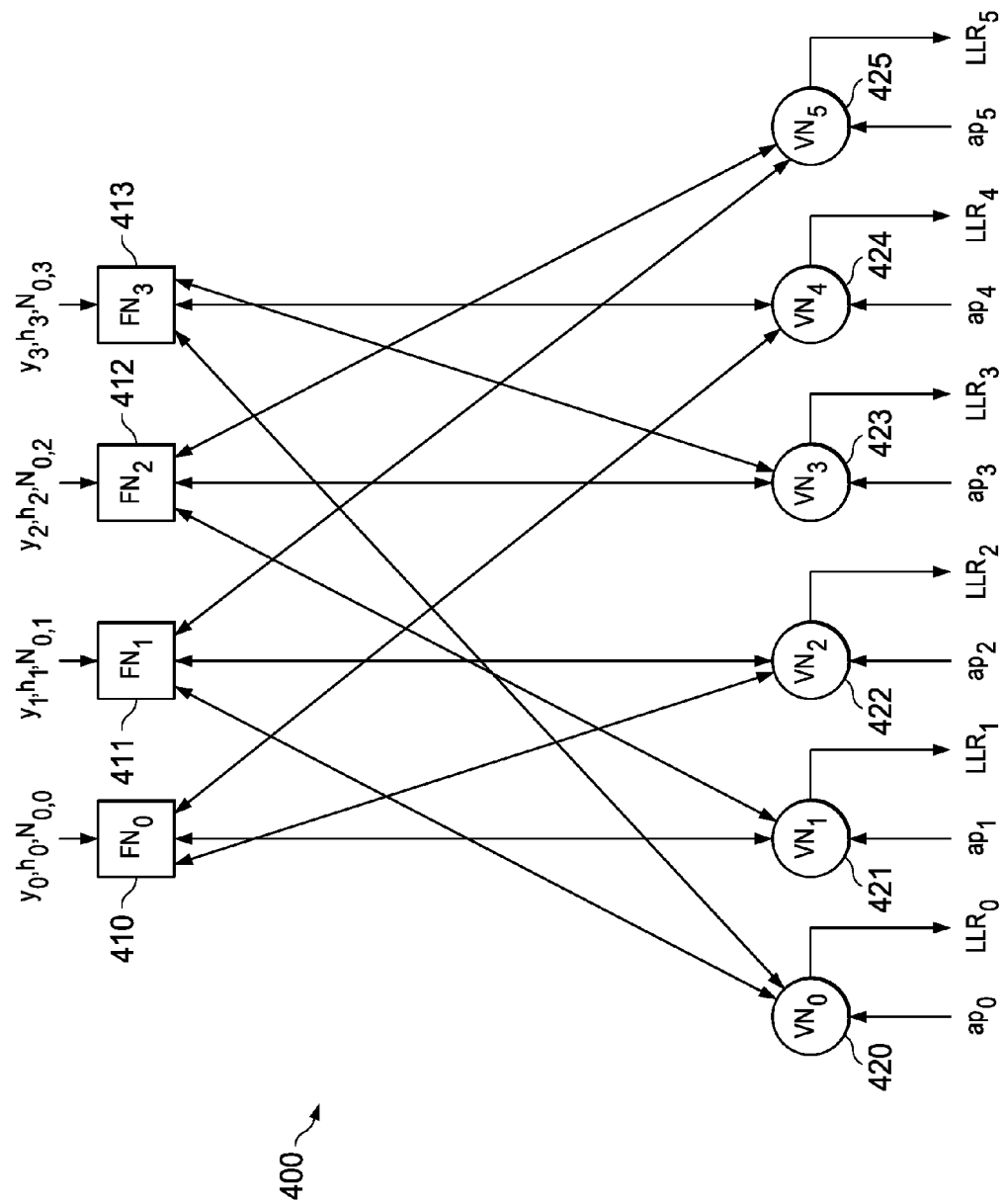
FIG. 4 illustrates an embodiment Tanner graph for a message passing algorithm (MPA)

The exchanging of messages between nodes of an MPA processor can be modeled using a Tanner graph. FIG. 3 illustrates a diagram of a multi-layer SCMA transmission scheme 300, and FIG. 4 illustrates a Tanner graph 400 of an iterative MPA processing technique to decode a signal carrying data streams transmitted according to the multi-layer SCMA transmission scheme 300. As shown in FIG. 3, the multi-layered SCMA transmission scheme 300 assigns the codebooks 350, 351, 352, 353, 354, 355 to the SCMA layers 320, 321, 322, 323, 324, 325, respectively. Each of the SCMA layers 320, 321, 322, 323, 324, 325 are mapped to a different combination of sub-carrier frequencies in the set of subcarrier frequencies 310, 311, 312, 313 over which the data streams are communicated. In particular, the SCMA layer 320 maps to the subcarrier frequencies 311, 313, the SCMA layer 321 maps to the subcarrier frequencies 310, 312, the SCMA layer 322 maps to the subcarrier frequencies 310, 311, the SCMA layer 323 maps to the subcarrier frequencies 312, 313, the SCMA layer 324 maps to the subcarrier frequencies 310, 313, and the SCMA layer 325 maps to the subcarrier frequencies 311, 312. Those skilled in the art will appreciate that if two devices (e.g. two different UEs) transmit using the same codebooks, a receiver may still be able to decode the two messages.

Based on the codebook or codebooks from the multi-layer SCMA transmission scheme assigned to a given data stream, samples from that data stream are encoded into codewords using the appropriate codebook. In the case of multiple codebooks, i.e., layers, being assigned to a given data stream, the codewords may be summed together prior to transmission. Each codeword within a respective codebook maps a different combination of symbols to the respective combination of sub-carrier frequencies. The data streams are then transmitted over a wireless network to a receiver.

As shown in FIG. 4, function nodes (FNs) 410, 411, 412, 413 of an SCMA decoder exchange messages with variable nodes (VNs) 420, 421, 422, 423, 424, 425 of the SCMA decoder in order to iteratively decode data streams of the received signal. The FNs 410, 411, 412, 413 are interconnected to the VNs 420, 421, 422, 423, 424, 425 via edges, which are represented by the lines in FIG. 4. The FNs 410, 411, 412, 413 calculate codeword probabilities based on information corresponding the respective sub-carrier frequencies during a first iteration of MPA signal processing. This information corresponding to the respective sub-carrier frequencies may include signal samples ($y_0$, $y_1$, $y_2$, $y_3$), channel estimation information ($h_0$, $h_1$, $h_2$, $h_3$), and noise information ($N_0$, $N_1$, $N_2$, $N_3$). The FNs 410, 411, 412, 413 then send the codeword probabilities in messages to the respective VNs 420, 421, 422, 423, 424, 425 over the respective edges.

The VNs 420, 421, 422, 423, 424, 425 may then compute codeword probabilities based on the messages received from FNs 410, 411, 412, 413 as well as APP values ($ap_0$, $ap_1$, $ap_2$, $ap_3$, $ap_4$, $ap_5$). During the first round of iterations in the inner feedback loop (e.g., prior to APP values being computed by the APP processor), the APP values used by the VNs 420, 421, 422, 423, 424, 425 indicate an equal probability for all of the codewords. During subsequent rounds of iterations in the inner feedback loop, the VNs 420, 421, 422, 423, 424, 425 may use the APP values provided by the APP processor. After computing the codeword probabilities, the VNs 420, 421, 422, 423, 424, 425 send the codeword probabilities in messages to the respective FNs 410, 411, 412, 413 over the respective edges. The FNs 410, 411, 412, 413 then use the codeword probabilities in the messages received from the VNs 420, 421, 422, 423, 424, 425 in addition to the information related to their corresponding sub-carrier frequency to compute/update their codeword probabilities. This iterative process continues until a stop condition is reached on the inner feedback loop. The codebooks maintained by the VNs 420, 421, 422, 425 425 may initially include an entire set of the codewords in the codebooks 350, 351, 352, 353, 354, 355 (respectively) used to transmit the data streams over the SCMA layers 350, 351, 352, 353, 354, 355. As the VNs 420, 422, 425 prune their codebooks in accordance with embodiments provided herein, the pruned codebooks maintained by the VNs 420, 422, 425 may contain a sub-set of the codewords (e.g., fewer than all codewords) in the codebooks 350, 352, and 355 (respectively) used to transmit the data streams.

Figure 5:
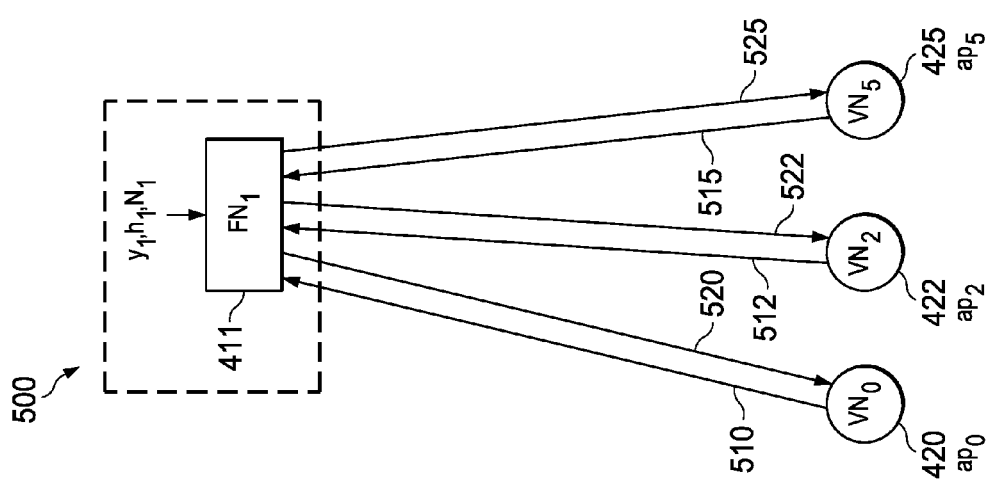
FIG. 5 illustrates an embodiment Tanner graph depicting a message exchange iteration from the point of view of a function node.

Pruning codebooks maintained by VNs reduces the computational complexity at FNs. FIG. 5 illustrates an example of an iteration of a message exchange from the point of view of the FN 411. In this example, the initial messages from the FNs to the VNs are not depicted. As shown, the FN 411 first receives messages 510, 512, 515 from the VNs 420, 422, 425 (respectively). The messages 510, 512, 515 include codeword probabilities computed by the VNs 420, 422, 425. In particular, the message 510 includes a set of codeword probabilities for codewords in a codebook maintained by the VN 420, the message 522 includes a set of codeword probabilities for codewords in a codebook maintained by the VN 422, and the message 515 includes a set of codeword probabilities for codewords in a codebook maintained by the VN 425. The FN 411 then generates the messages 520, 522, 525, and sends the messages 520, 522, 525 to the VNs 420, 422, 425. The message 520 includes codeword probabilities for the set of codeword probabilities for codewords in the codebook maintained by the VN 420. Codeword probabilities in the message 520 are generated as a function of the codeword probabilities in the messages 512, 515 as well as signal samples ($y_1$), channel estimation information ($h_1$), and noise information ($N_1$) corresponding to the sub-carrier frequency 311 assigned to the FN 411. Likewise, the message 522 includes codeword probabilities for the set of codeword probabilities for codewords in the codebook maintained by the VN 422, and the message 525 includes codeword probabilities for the set of codeword probabilities for codewords in the codebook maintained by the VN 425. Codeword probabilities in the message 522 are calculated as a function of the codeword probabilities in the messages 510, 515 and the signal samples ($y_1$), channel estimation information ($h_1$), and noise information ($N_1$) corresponding to the sub-carrier frequency 311 assigned to the FN 411. Codeword probabilities in the message 525 are calculated as a function of the codeword probabilities in the messages 510, 512 and the signal samples ($y_1$), channel estimation information ($h_1$), and noise information ($N_1$) corresponding to the sub-carrier frequency 311 assigned to the FN 411.

In this example, the number of codewords in the codebooks maintained by the VNs 420, 422, and 425 is directly related to the number of codeword probabilities that are calculated by the FN 411. It should also be appreciated that the number of codewords in the codebook maintained by the VN 420 directly affects the number of interfering codewords that are taken into consideration when generating the messages 522, 525. Likewise, the number of codewords in the codebook maintained by the VN 422 directly affects the number of interfering codewords that are taken into consideration when generating the messages 520, 525, and the number of codewords in the codebook maintained by the VN 425 directly affects the number of interfering codewords that are taken into consideration when generating the messages 520, 522. Thus, pruning the codebooks maintained by the VNs 420, 422, and 425 may reduce the computational complexity at the FN 411.

Figure 6:
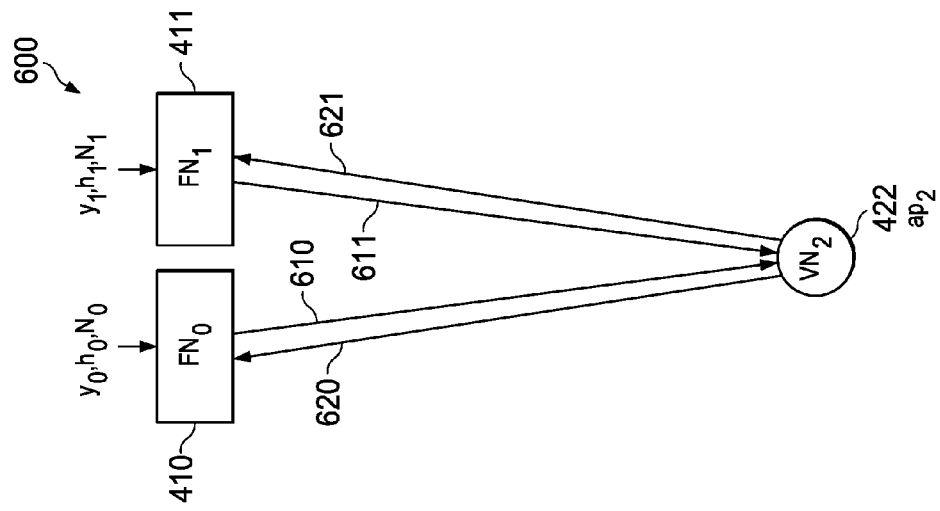
FIG. 6 illustrates an embodiment Tanner graph depicting a message exchange iteration from the point of view of a variable node.

Pruning codebooks maintained by VNs also reduces the computational complexity at VNs. FIG. 6 illustrates an example of iterative message exchange from the point of view of the VN 422. As shown, the VN 422 receives messages 610, 611 from the FNs 410, 411 respectively. The messages 610, 611 include codebook probabilities for codewords in a codebook maintained by the VN 422. The codebook probabilities in the message 610 are computed as a function of the signal samples ($y_0$), channel estimation information ($h_0$), and noise information ($N_0$) corresponding to the sub-carrier frequency 310 assigned to the FN 410. If the depicted iteration is a subsequent iteration (e.g., not the first iteration of the current inner feedback loop), then the codebook probabilities in the message 610 may also be computed as a function of codebook probabilities in messages communicated from the VNs 420, 421 to the FN 410 during a previous iteration.

The codebook probabilities in the message 611 are computed as a function of the signal samples ($y_1$), channel estimation information ($h_1$), and noise information ($N_1$) corresponding to the sub-carrier frequency 311 assigned to the FN 411. If the depicted iteration is a subsequent iteration (e.g., not the first iteration of the current inner feedback loop), then the codebook probabilities in the message 611 may also be computed as a function of codebook probabilities in messages communicated from the VNs 424, 425 to the FN 411 during a previous iteration.

Upon reception of the messages 610, 611, the VN 422 computes codebook probabilities for codewords in the codebook maintained by the VN 422, and then sends the codebook probabilities to the FNs 410, 411 via the messages 620, 621. The set of codebook probabilities communicated in the message 620 are calculating as a function of information in the message 611 and APP values (ap2) associated with the codebook maintained by the VN 422. The set of codebook probabilities communicated in the message 621 are calculating as a function of information in the message 610 and the APP values (ap2) associated with the codebook maintained by the VN 422.

In this example, the number of codewords in the codebook maintained by the VN 422 is directly related to the number of codeword probabilities that are calculated by the VN 422. Thus, pruning the codebook maintained by the VN 422 may reduce the computational complexity at the VN 422.

There are a variety of encoding schemes which may be used for transmitting data. A message passing algorithm (MPA) may be used for decoding the transmitted data. One example of an encoding scheme is a convolutional code. Convolutional codes operate on streams of bits or symbols having an arbitrary length. Convolutional codes may be soft decoded, for example using the Viterbi algorithm or another soft decoding algorithm. A convolutional code which is terminated is also a block code. Terminated convolutional codes include tail-biting and bit-flushing codes. Block codes operate on fixed size blocks, or packets, of bits or symbols having a predetermined size. Block codes may be hard-determined in polynomial time to their block length. Block codes include classical block codes and modern block codes.

Classical block codes include Reed-Solomon coding, Golay coding, Bose Chauduri Hocquengham (BCH) coding, multi-dimensional parity coding, and Hamming coding. Modern block codes include low-density parity check (LDPC) coding. LDPC codes are highly efficient linear block codes made from many single parity check (SPC) codes. Concatenated codes incorporate both a classical block coding and a convolutional coding.

Turbo coding is an iterated soft-decoding scheme which combines two or more convolutional codes and an interleaver to produce a block code. Rateless Fountain Codes include Luby Transform (LT) codes. The code words of an LT code are generated based on k information symbols based on a probability distribution on the numbers 1, . . . , k. Each codeword symbol is obtained independently, by first sampling the distribution to obtain a number d, and adding the values of d randomly chosen information symbols. Raptor codes are a modified version of LT codes, where the information sequence of k symbols is pre-coded by a high rate block code, and n symbols are used to generate the Raptor codeword symbols as in LT codes. Another encoding method involves polar codes. A polar code is a linear block error correcting code. Polar codes can be systematic or non-systematic.

As discussed above, SCMA is a non-orthogonal multiple access scheme, using sparse codebooks to convey user data symbols. SCMA typically requires an advanced receiver that can be implemented with reasonable complexity that is made possible by the sparsity of SCMA codebooks Where encoding methods or access schemes are used, iterative decoding methods are often applied. An embodiment method of decoding involves an inner MPA which uses feedback information from a soft decoding outer iterative decoder. A priori knowledge of the received encoded data fed back by the outer decoder to the inner MPA can be used to reduce the MPA decoding schedule by eliminating highly unlikely possibilities from computations. The feedback information may take the form of a priori probabilities or log-likelihood ratios (LLRs). When the feedback data indicates that a codeword is unlikely, it can be pruned from the codebook (also referred to as an alphabet). This allows for a simplified set of inner loop iterations due to a simplification of the scheduling of the function nodes and variable nodes. When an alphabet is used, the decoding process considers every alphabet entry in the initial set of inner loop iterations. In the next outer loop iteration, the alphabet may be reduced to include only a subset of the alphabet entries, or only one alphabet entry, when the feedback indicates that alphabet entries outside the subset are highly unlikely. In one example, a subset of an alphabet is determined to be unlikely, leaving another subset, which is evaluated. When only one alphabet entry is considered, an extreme value is assigned to the likelihood value of that alphabet entry, which is used within a function node update, and another LLR corresponding to the extreme value is assigned to the MPA output for that variable node. Those skilled in the art will appreciate that although the above description is based on starting with a complete alphabet and pruning out alphabet entries to reduce the alphabet size, it may be possible to create the reduced alphabet in reverse by having a list of possible alphabet entries and then building the alphabet based on the entries in the list that have sufficiently high likelihoods/probabilities.

The complexity of an MPA based decoder for coding schemes such as SCMA, low density signature-orthogonal frequency-division multiplexing (LDS-OFDM), LDPC codes, or another forward error correction (FEC) code, may be used with a priori knowledge of bits being decoded. During the decoding of a received block or symbol, the MPA may use the soft output of the outer decoder. Knowing a priori that certain encoded bits are highly likely to be the correct bits may facilitate assigning a high likelihood value to the known values, and reducing the MPA update schedules to avoid considering unlikely bit values. An embodiment reduces the complexity of an inner MPA decoding function using a priori knowledge feedback from a soft decision outer decoder.

SCMA decoders typically make use of an MPA processor for recovery of the transmitted SCMA codewords. The relationship between SCMA codebooks, which spread their codewords across the same resource elements (REs) and subcarriers, along with the MPA used to decode these codewords, may be visualized using a Tanner graph. Each Tanner graph node works in isolation, only accessing the messages on its connected edges. An edge is the link in the Tanner graph that connects two nodes. For an SCMA decoder, the messages that are exchanged between FNs and VNs are probabilities that represent a level of belief regarding the possible received codewords.

In one MPA iteration of an SCMA decoder, the FNs compute messages to send across the edges to their connected VNs. Upon receiving the messages from the FNs, each VN computes messages to send across the edges to the connected FNs. The FNs receive extrinsic information as input. For example, FN 410 receives $y_0$, $h_0$, and $N_{0,0}$, FN 411 receives $y_1$, $h_1$, and $N_{0,1}$, FN 116 receives $y_2$, $h_2$, and $N_{0,2}$, and FN 118 receives $y_3$, $h_3$, and $N_{0,3}$, where $y_n$ is the received signal vector on subcarrier n, $h_n$ is the channel estimation for subcarrier n, and $N_{0,n}$ is the noise estimate for subcarrier n. The FNs perform calculations, and send messages to their connected VNs. The VNs receive information from the connected FNs and use these messages, along with the input ap values to generate messages for the FNs as discussed above. This process can be repeated until a stopping criterion is reached.

The kth variable node, $VN_k$, represents the transmitted SCMA codeword using the codebook $c_k$ being recovered in the node. $VN_k$ is connected to $d_v$ FNs. Following the final iteration of the MPA decoder, the VNs output a vector, where each element represents the LLR of that bit having been 0 when encoded by the transmission SCMA encoder based on $c_k$.

Messages are passed between two FNs and $VN_k$. The messages include the probabilities that the transmitted SCMA codeword from $c_k$ being decoded is each of the M possible codewords from $c_k$. That is:

$$Pr\{\widehat{c_k} = C_k(2)\}, \ldots Pr\{\widehat{c_k} = C_k(M)\},$$

based on the messages arriving at the node. The messages are refined in each iteration, with information flowing from the different nodes in the MPA. The messages passed to $FN_n$ are based on the messages from the previous decoder iteration from all other FNs connected to $VN_k$, using the notation:

$$I_{q_k \to c_n}.$$

The messages passed to $VN_k$ are based on the messages from the previous decoder iteration from all other VNs connected to $FN_n$, using the notation:

$$I_{c_n \to q_k}.$$

The messages contain extrinsic information, because the sending node computes the messages with information from all connected nodes besides the destination node.

There are some relevant MPA parameters which are used in the SCMA decoder and for developing the SCMA codebooks. There are $d_f=3$ VNs connected to each FN. Also, there are $d_v=2$ FNs connected to each VN. Each codeword spreads across K=4 subcarriers or REs, so there are K FNs. Also, there are J=6 codebooks which may transmit at the same time, so there are J VNs. Additionally, there are M=SCMA codewords within an SCM codebook M={4, 8, 16}. There are M messages in:

$$I_{q_k \to c_n}$$

and $$I_{c_n \to q_k}.$$

The MPA decoder stops after $N_t=15$ iterations.

Standard MPA implementations are computationally expensive. The computation of values at the FNs is particularly computationally expensive due to the computationally intensive nature of determining values for each edge.

In SCMA, four values correspond to possible codewords within the codebook. When a bit is fixed, half of the possible codewords, or alphabets, may be discarded. By discarding codewords, a new codebook is obtained. The decoding schedule in MPA processor 222 is adjusted based on the fixed bits (i.e. based on the new codebook). A new cycle with a set of MPA iterations is performed, to obtain a new set of LLRs, which are sent to the FEC. This is repeated until the codeword is decoded.

Figure 7:
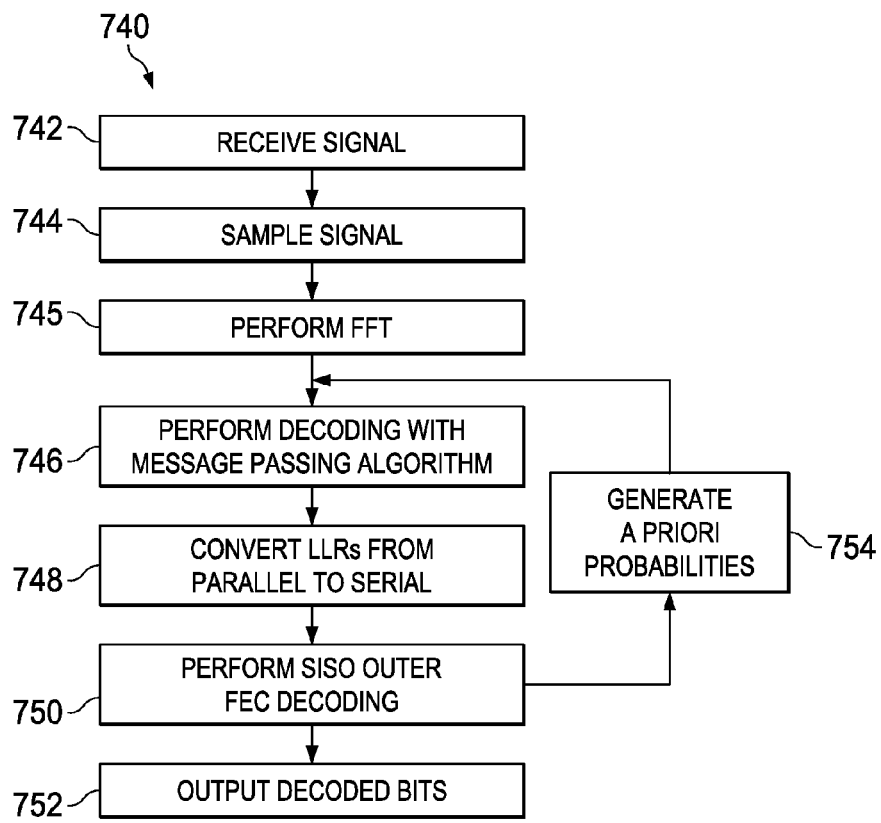
FIG. 7 illustrates a flowchart of an embodiment method of decoding using an MPA.

FIG. 7 illustrates flowchart 740 for an embodiment method of decoding using an MPA. Initially, in step 742, a signal is received by a system. The received signal corresponds to an encoded that has been transmitted and received by a receiver. Next, in step 744, the received signal is sampled to obtain a sequence of samples.

Then, in step 745, a fast Fourier transform (FFT) is performed on the sequence of samples. The FFT (which may be implemented as a discrete Fourier transform (DFT)) is used convert the sequence of samples from the time domain to the frequency domain. An FFT may be used to rapidly compute the transform by factorizing the DFT matrix into a product of sparse factors.

In step 746, decoding is performed using an MPA on the sampled received signal. The MPA is done based on the received samples and a decoder codebook, and may take into account other information including channel and noise models. In the first iteration of the MPA, the MPA is performed without the use of APP feedback values (as during the first iteration, there have been no APPs generated so all codewords in active the codebooks/layers are considered to be equally likely to have been transmitted). The iterative process is repeated until a stopping criterion is met. In some embodiments, a set of stopping criteria may be reached if either a set number of iterations have occurred or until the results sufficiently converge.

In step 748, the LLRs may optionally be converted from parallel to serial. When the MPA completes the inner iterations, it has a set of LLRs available as output. These LLRs are typically provided to a FEC processor in series. Those skilled in the art will appreciate that the serialization of the LLRs may not be necessary depending on the design of a FEC processor.

Then, in step 750, soft-in soft-out (SISO) outer FEC decoding is performed on the LLRs. A SISO decoder is a type of soft-decision decoder commonly used with error correcting codes. Soft-in refers to the fact that the incoming data may have values between 0 and 1 to indicate reliability. Similarly, soft-out refers to the fact that each bit in the decoded output also takes on a value indicating reliability.

In step 750 a decision on the decoding is made. If the results are found to have sufficient confidence, the decoding process can stop and the decoded bit values are output in step 752. The decoded bit values may be transmitted for use. If the decoding process has not concluded in step 750, a set of LLRs is provided as the input for an a priori probability generation in step 754. The a priori probability values are fed back to the MPA. This is the conclusion of a single outer loop iteration. A subsequent inner loop set of iterations of the MPA is performed in step 746. In subsequent inner loop iterations, codewords may be removed from the alphabet based on the feedback values. By pruning the overall decoding alphabet based on very high or very low likelihood values (or the corresponding APP values) it is possible to reduce the number of operations required in the inner loop iterative process. In some embodiments, the alphabet is reduced when some, but not all, of the a priori probability values are extreme. When all of the a priori probability values are extreme, MPA operations related to this VN are not performed, and the LLR values corresponding to the extreme a priori probability values are automatically output. The values for other VNs (which do not have extreme APP or LRR values) are still computed.

It should be understood that in subsequent executions of step 746, the APP values from step 154 are used as an initial condition in step 746. An APP value indicates the likelihood of a codeword in the alphabet. This information can be used in the iterations, and can also be used to determine that codewords (or groups of codewords) can be removed from the alphabet. In other embodiments, the pruning of the codebook can be based on the LLR output by the FEC.

Figure 8:
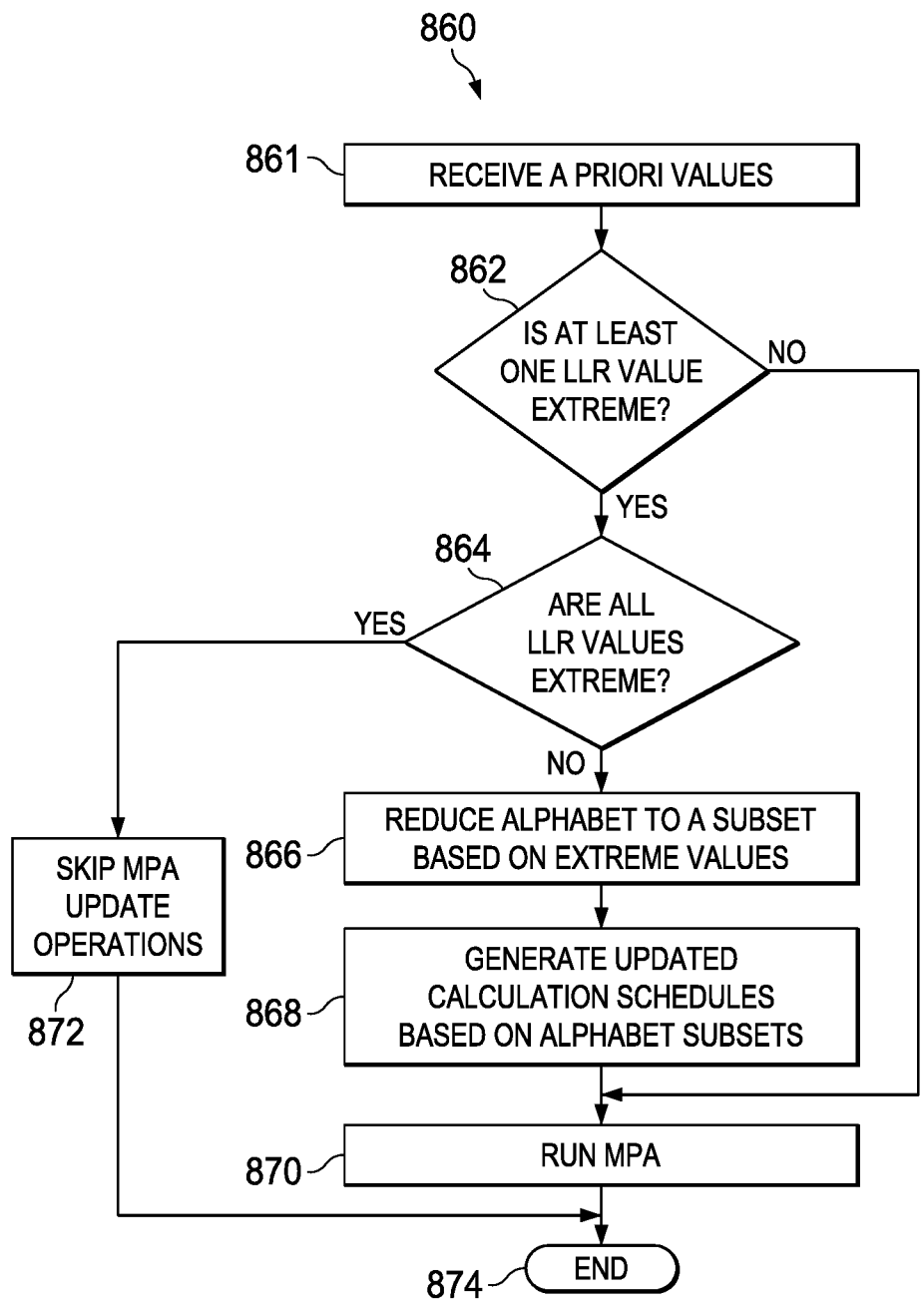
FIG. 8 illustrates a flowchart of an embodiment method of using an MPA.

FIG. 8 illustrates flowchart 860 for an embodiment method of MPA calculation using alphabet reduction. This method may be performed for MPA iterations after the initial iteration. Initially, in step 861, the feedback values, such as a priori probability values or LLR values, are received. The probability values received in step 861, indicate the likelihood of the different bits being either a 0 or a 1. An extreme likelihood value (in comparison to either a threshold or to the other probability values, indicates a very strong likelihood of a particular value.

Next, in step 862, the system determines whether at least one LLR value is extreme. When an LLR value is extreme it indicates a very high level of certainty for a bit value. In one example, the a priori probability values are four bits and range from zero to fifteen, where zero indicates that the LLR value is 0 and a fifteen indicates that the LLR value is 1. In one example, values of 1, 2, 13, and 14 are considered to be extreme values. In another example, only values of 1 and 14 are considered to be extreme values. In another example, eight bits are used, and the a priori probability values range from zero to 127. In one example, the feedback values are identified as being extreme by comparing them to a predefined threshold. In another example, the feedback value is compared one or more dynamic threshold based on some rule set. In an additional example, the feedback value is compared to other feedback values to determine if it is extreme. For example, when the MPA is initialized, the a priori values are set to the same value. This avoids pruning of the alphabet in the first set of iterations. At the end of the first outer iteration, the LLRs from the FEC can be used as feedback values. If there is an identified extreme value, pruning of the alphabet can occur. In another example, if all feedback values are similar, it can be concluded that the feedback does not provide sufficient information to justify prune the alphabet When none of the LLR values are extreme, the system proceeds to step 870 to run the MPA without reducing the alphabet. When at least one a LLR value is extreme, the system proceeds to step 864.

In step 864, the system determines whether all of the LLR values are extreme. When some, but not all, of the LLR values are extreme, the system proceeds to step 866 to perform alphabet reduction. When all of the feedback values are extreme, the system proceeds to step 872.

If, in step 864, all LLRs are extreme and are indicative of the same result, the MPA process can be skipped in step 872 and the inner loop ends in step 874. Alternatively, if only some LLR values are extreme, the alphabet can be reduced to a subset alphabet based on the extreme feedback values in step 866. Bit values associated with the extreme feedback values are fixed, and only the codewords having bits corresponding to the fixed bits are considered.

Then, in step 868, an updated computation schedule is calculated based on the pruned subset of the alphabet that forms the new alphabet. Only the calculations which use the reduced alphabet are used. Then, the system proceeds to step 870.

In step 870, the MPA is performed. If the alphabet has been pruned, only the reduced alphabet is used during the MPA. The MPA is performed iteratively until a stopping point is reached.

In an FN, the message from the FN to the VN may be given by:

$$I_{c_n \to q_k}(i) = \Sigma_{\alpha=1}^{|C_a|} \Sigma_{\beta=1}^{|C_b|} \phi_n(y_n, \alpha, \beta, i, N_{0,n}, h_n)(I_{q_a \to c_n}(\alpha) I_{q_b \to c_n}(\beta)),$$

for $i=1, \ldots, |c_k|$, where n indicates the FN and k indicates the VN. Also:

$$I_{c_n \to q_k}$$

indicates the ith message from FN n along the edge to VN k, and $$I_{q_k \to c_n}$$

indicates the ith message from VN k along the edge to FN n.

When the a priori probabilities corresponding to VN k are sufficiently extreme to eliminate all but one likely codeword at that node, the updating of all messages from an FN to VN k may be removed from the schedule. This means that the values of:

$$\phi_n(y_n, \alpha, \beta, i, N_{o,n}, h_n)$$

and $$I_{c_n \to q_k}(i)$$

are not computed for any value of n or i.

When a subset of the a priori probabilities corresponding to VN k are sufficiently extreme to eliminate a subset of the likely codewords at that node:

$$\phi n(y_n, \alpha, \beta, i, N_{o,n}, h_n)$$

and:

$$I_{c_n \to q_k}(i)$$

are only computed for values of i corresponding to the remaining likely codewords. When a subset of codewords is evaluated, a bias or scaling may be applied to:

$$\phi_n(y_n, \alpha, \beta, i, N_{o,n}, h_n),$$

and/or to:

$$I_{c_n \to q_k}(i)$$

When the a priori probabilities corresponding to VN a and/or to VN b are sufficiently extreme to eliminate some or all but one likely codeword for that node, the set of combinations over which:

$$\phi_n(y_n, \alpha, \beta, i, N_{o,n}, h_n),$$

and:

$$I_{c_n \to q_k}(i)$$

are computed is reduced by only using the subsets of $\alpha=1, \ldots, |C_a|$ and $\beta=1, \ldots, |C_b|$ corresponding to the remaining likely codewords for VNs a and b.

In another example, a log-MAP max-log-MAP variant is used for the MPA where the messages are comprised of log-likelihood value representations instead of probabilities or likelihoods. In this example, the message from the FN to the VN may look more like the following:

$$I_{c_n \to q_k}(i) = \max(\phi_n(y_n, \alpha, \beta, i, N_{0,n}, h_n))(I_{q_a \to c_n}(\alpha) + I_{q_b \to c_n}(\beta)).$$

Regardless of the numerical representation, so long as the underlying MPA algorithm is being used in the decoder, the above complexity reductions due to the present invention may be realized.

Figure 9:
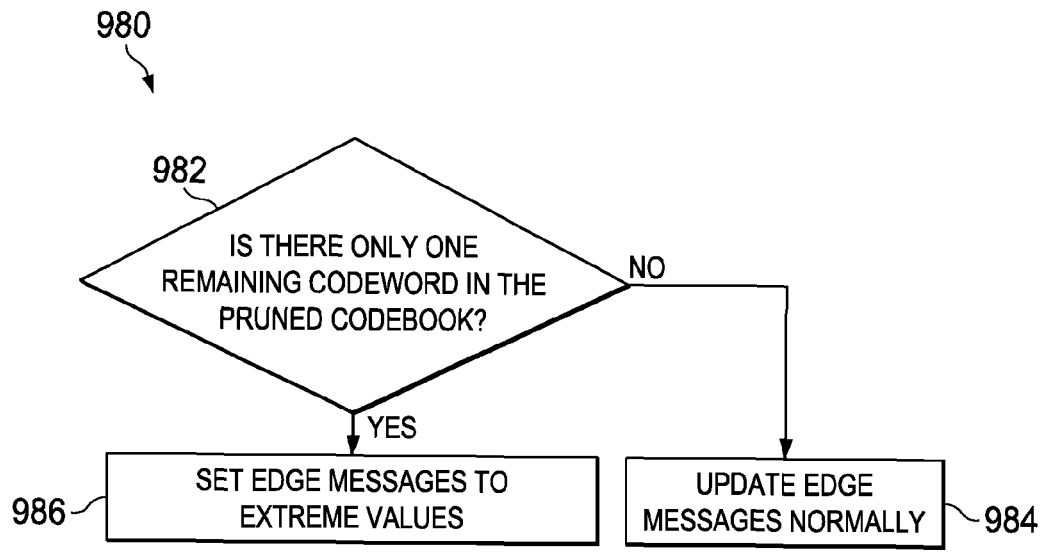
FIG. 9 illustrates a flowchart of an embodiment method of variable node message updating for an MPA.

In an example, a code such as an LDPC code, is used. The sampled sequence representing the received signal is provided to the variable nodes as input. FIG. 9 illustrates flowchart 980 for an embodiment method of variable node message updating, for example using an LDPC code. Initially, in step 982, the variable node determines whether there is only one remaining codeword in the pruned codebook. If there is only one codeword, the method proceeds to step 986. In step 986, the variable node sets the edge message to an appropriate extreme value. When the feedback value is not extreme, the variable node proceeds to step 984. In step 984, the variable node sets updates the edge messages for the parity check nodes normally.

Figure 10:
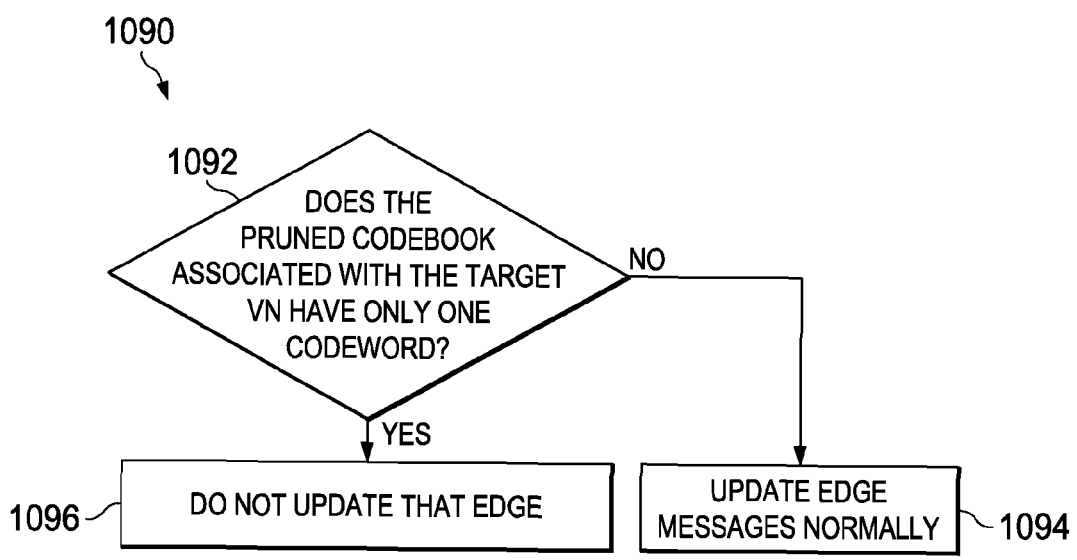
FIG. 10 illustrates a flowchart of an embodiment method of parity check node message updating for an MPA.

FIG. 10 illustrates flowchart 1090 for a method at either a parity check node or a function node. In step 1092, the node determines whether the pruned codebook associated with the target VN has only 1 codeword. When this condition is satisfied, the process continues to step 1096, an in the alternate proceeds to step 1094. In step 1096, the node does not perform an update for the edge associated with the VN with a 1 entry codebook. In step 1094 where the node updates the edge messages normally.

Figure 11:
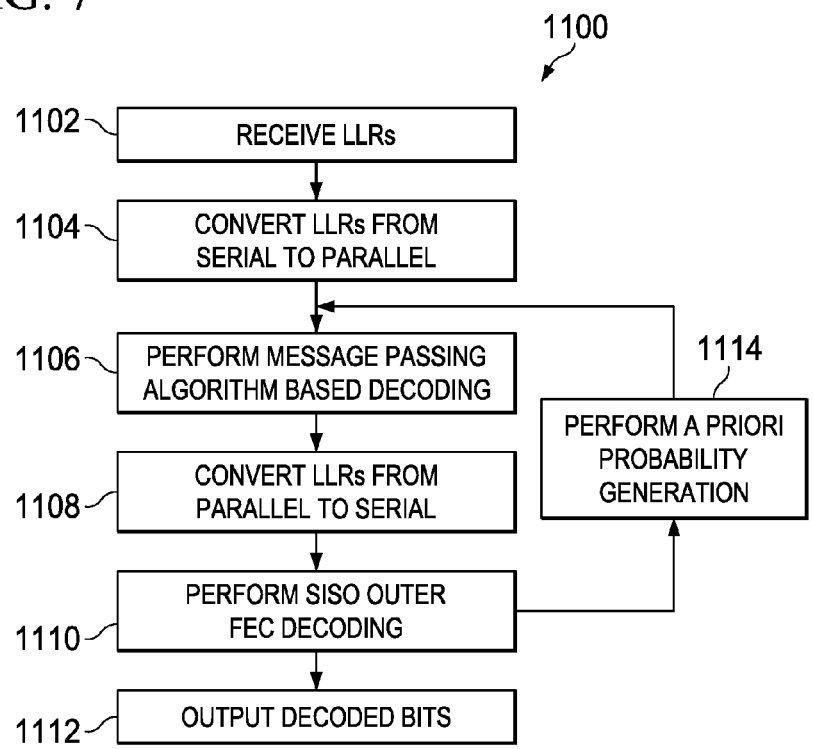
FIG. 11 illustrates a flowchart of another embodiment method of decoding using an MPA.

FIG. 11 illustrates flowchart 1100 for an embodiment method of decoding using an MPA. Initially, in step 1102, the method starts with the receipt of LLR values as the feedback values. If these values are received in series an optional step 1104 is performed to ensure that the LLR values are provided to the MPA processor in parallel.

In step 1106, the system performs an MPA decoding process. In the first iteration, the MPA decoding is performed assuming that all codewords are equally likely. In subsequent iterations, APP values are received that provide different initial conditions for the MPA based on the likelihood of different codewords.

In step 1108, LLR values from the MPA decoding are optionally converted from a parallel set of LLRs to serial set LLRs so that they can be transmitted to an FEC processor designed for receipt of a series of LLR values. Those skilled in the art will appreciate that if the FEC processor is capable of receiving a set of LLR values in parallel, this step can be bypassed.

Next, in step 1110, the system performs FEC decoding (e.g. SISO outer FEC decoding) on the LLRs. If stopping conditions for the outer iterative loop have been met, then the system can output the decoded bits in step 1112. If the stopping conditions are not met, then the FEC decoder provides a set of LLRs as output. These LLRs are used both as feedback to the MPA, and in the generation of APP values.

Also, in step 1114, the system generates a priori probability values. The a priori probability values are fed back to the MPA decoding in step 1106. The LLRs from step 210 are also used to prune the codebook based on bit level confidence as described above. This allows some codewords to be removed from the alphabet which reduces the number of calculations in subsequent iterations. When in step 1112 it is determined that outer loop stopping criteria have been met, the decoding process can terminate with step 1112 in which the decoded bits are output.

Figure 12:
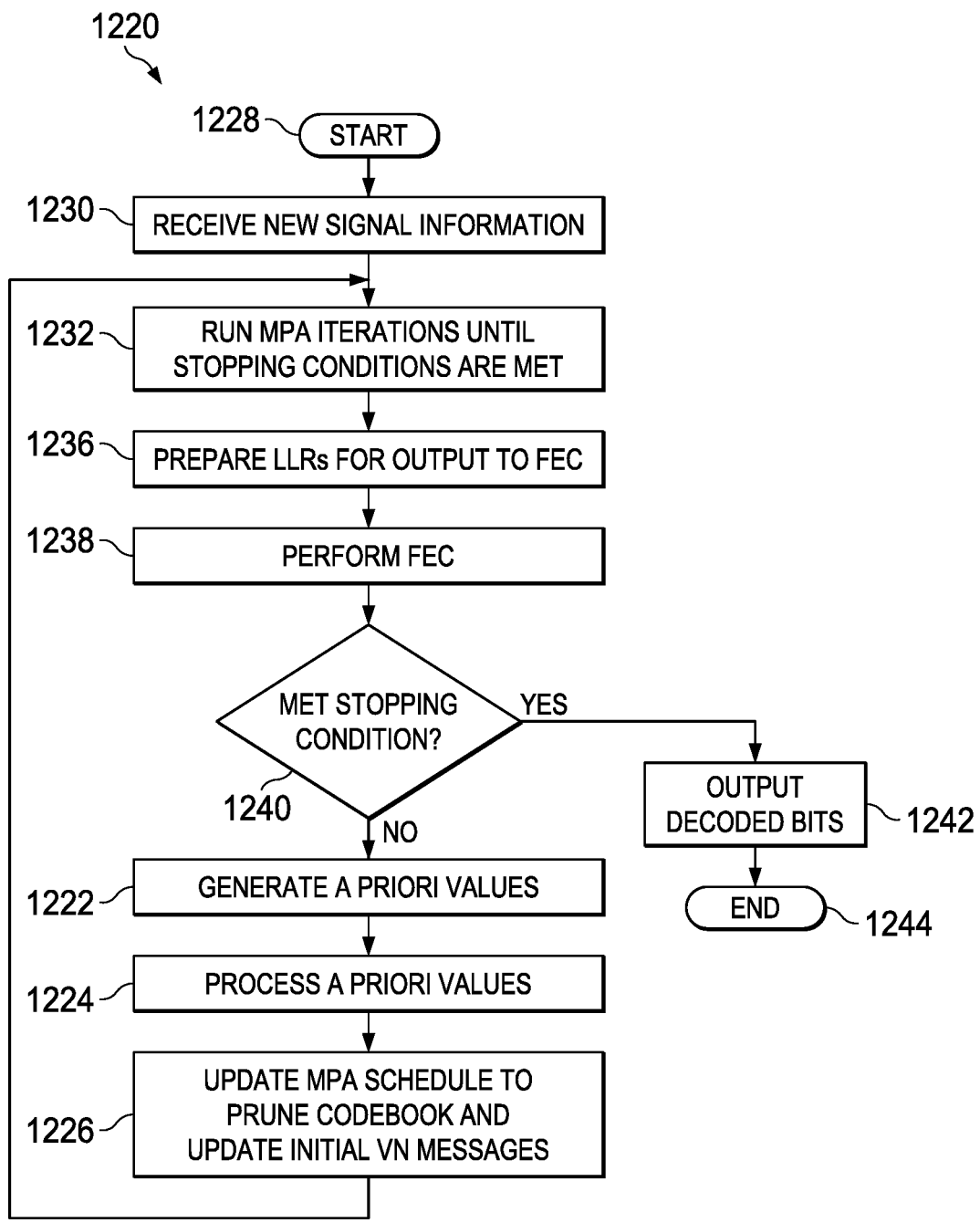
FIG. 12 illustrates a flowchart of an embodiment method of performing a turbo MPA.

FIG. 12 illustrates flowchart 1220 for an embodiment method of performing a turbo MPA. Initially, in step 1228, the method starts. Then, in step 1230, the system receives new signal information. In one example, the new signal information is a new signal. In step 1232, the system runs an iterative MPA. The MPA iterations are performed until stopping conditions are met. In step 1236, the iterative MPA generates a set of LLRs as its output which is provided as the input to a FEC process. Then, in step 1238, FEC is performed using the LLR values determined in step 1236.

In step 1240, the system determines whether stopping conditions for the iterative outer loop have been met. When stopping conditions have been met, the system proceeds to step 1242 where the decoded bits are output and the process ends at step 1244 When stopping conditions have not been met, the method continues to step 1222.

In step 1222, the LLR values output by the FEC are used to generate a priori probability values. The APP values are provided to the MPA in step 1224 where they replace the APP values used in the previous inner loop iterations.

Next, in step 1226, the MPA decoding schedule is updated to prune codewords from the available codebook. Then, the system proceeds to step 1232 to again run the MPA with the reduced alphabet.

Figure 13:
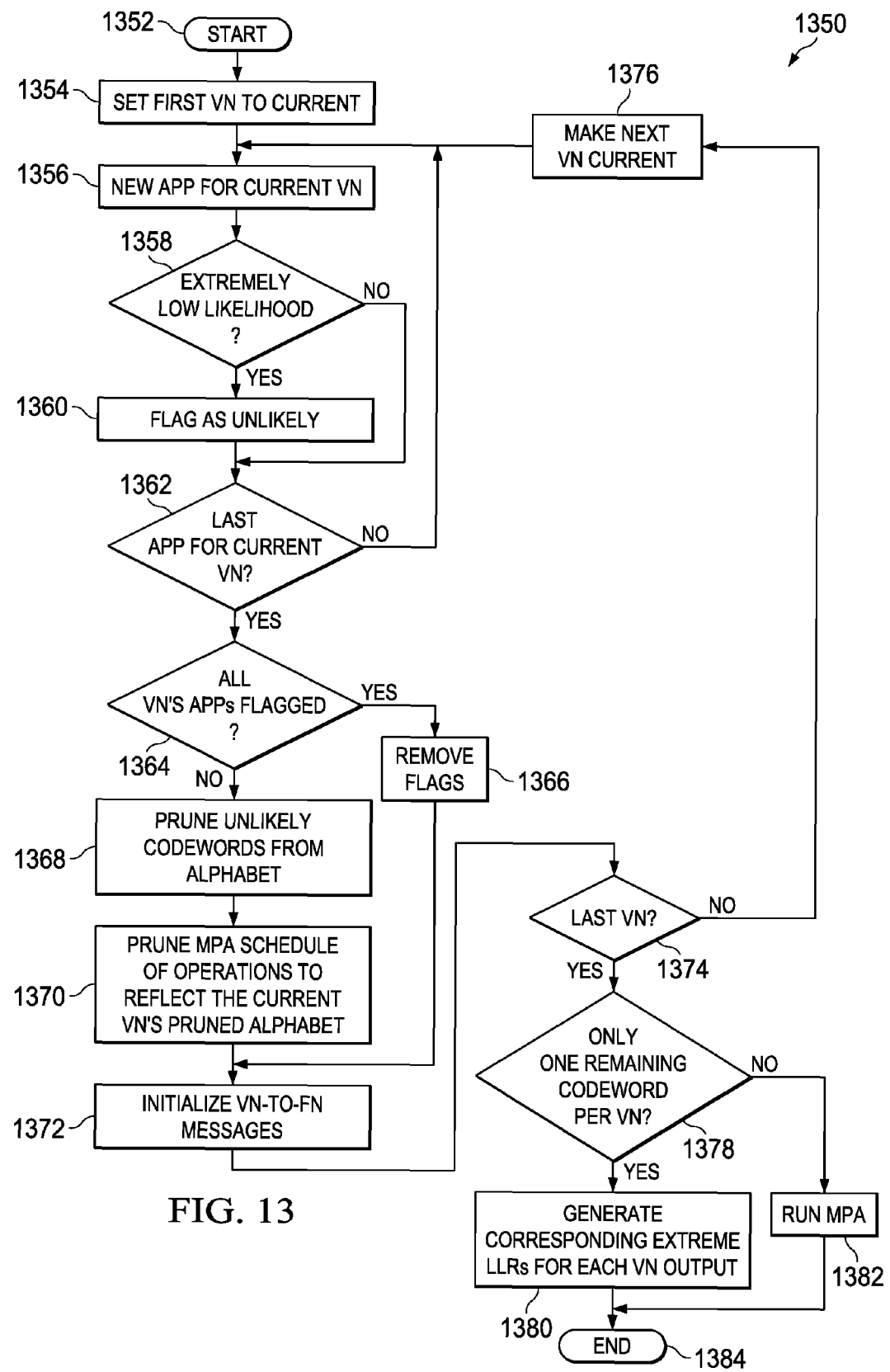
FIG. 13 illustrates a flowchart of an embodiment method of determining a priori probabilities.

FIG. 13 illustrates flowchart 1350 for an embodiment method of a priori probability processing. Initially, in step 1352, the method starts. In step 1354, the system sets the first VN to be the current VN. Then, in step 1356, the system determines new a priori probabilities (APPs) for the current VN. The system cycles through the APPs. In step 1358, the system determines whether an APP indicates an extremely low likelihood. When the APP does not indicate an extremely low likelihood, the system proceeds to step 1362. On the other hand, when the APP indicates an extremely low likelihood, the system proceeds to step 1360. In step 1360, the APP is flagged as unlikely. Then, the system proceeds to step 1362. In step 1362, the system determines whether the last APP examined is the last APP for the current APP. When the APP is the last APP for the current VN, the system proceeds to step 1364. On the other hand, when the APP is not the last APP for the current VN, the system proceeds to step 1356 to examine the next APP for the current VN. In step 1364, the system determines whether all APPs in the VN have been flagged. When all APPs in the VN have been flagged, the system proceeds to step 1366. When not all of the APPs in the VN have been flagged, the system proceeds to step 1368.

In step 1366, the system removes all flags. When all of the APPs in the VN are flagged, the flagging of the APPs is not useful, because it is not desirable to prune all of the APPs. Then, the system proceeds to step 1372.

In step 1368, the system prunes unlikely codewords from the alphabet.

Next, in step 1370, the system prunes the MPA schedule of operations to reflect the pruned alphabet of the current VN. In step 1372, the system initializes VN to FN messages from the current VN.

Then, in step 1374, the system determines whether the current VN is the last VN. When the current VN is not the last VN, the system proceeds to step 1376. On the other hand, when the current VN is the last VN, the system proceeds to step 1378.

In step 1376, the system proceeds to the next VN, and assigns the next VN to be the current VN. Then, the system proceeds to step 1356 do determine the APPs for the next VN.

In step 1378, the system determines whether there is only one remaining codeword per VN. When there is only one remaining codeword per VN, the system proceeds to step 1380. When there is more than one remaining codeword for at least one VN, the system proceeds to step 1382.

In step 1380, the system generates extreme LLR values based on the remaining codewords for each VN output. Then, the system proceeds to step 1384, and the method ends.

In step 1382, the system runs the MPA. Also, the system proceeds to step 1384, and the method ends.

The MPA may be performed serially or in parallel. Parallel processing is faster. However, alphabet reduction may have a greater impact on speed in a serial implementation. In parallel implementations, the hardware not in use may be powered down to same energy. In some embodiments, the computational complexity is reduced. The reduction in computational complexity may be an exponential reduction in computation, and may lead to a reduction in the time spent and power consumed by the decoding process. Also, an embodiment may strengthen the decoding capabilities, leading to quicker convergence. In an embodiment, the decoder hardware requirements are reduced, along with the decoding latency.

Figure 14:
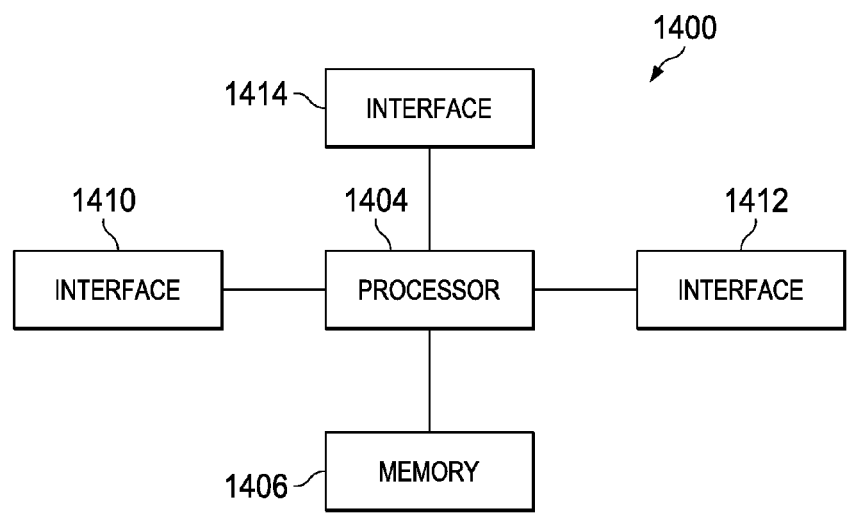
FIG. 14 illustrates a block diagram of an embodiment processing system.

FIG. 14 illustrates a block diagram of an embodiment processing system 1400 for performing methods described herein, which may be installed in a host device. As shown, the processing system 1400 includes a processor 1404, a memory 1406, and interfaces 1410-1414, which may (or may not) be arranged as shown in FIG. 14. The processor 1404 may be any component or collection of components adapted to perform computations and/or other processing related tasks, and the memory 1406 may be any component or collection of components adapted to store programming and/or instructions for execution by the processor 1404. In an embodiment, the memory 1406 includes a non-transitory computer readable medium. The interfaces 1410, 1412, 1414 may be any component or collection of components that allow the processing system 1400 to communicate with other devices/components and/or a user. For example, one or more of the interfaces 1410, 1412, 1414 may be adapted to communicate data, control, or management messages from the processor 1404 to applications installed on the host device and/or a remote device. As another example, one or more of the interfaces 1410, 1412, 1414 may be adapted to allow a user or user device (e.g., personal computer (PC), etc.) to interact/communicate with the processing system 1400. The processing system 1400 may include additional components not depicted in FIG. 14, such as long term storage (e.g., non-volatile memory, etc.).

In some embodiments, the processing system 1400 is included in a network device that is accessing, or part otherwise of, a telecommunications network. In one example, the processing system 1400 is in a network-side device in a wireless or wireline telecommunications network, such as a base station, a relay station, a scheduler, a controller, a gateway, a router, an applications server, or any other device in the telecommunications network. In other embodiments, the processing system 1400 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 15:
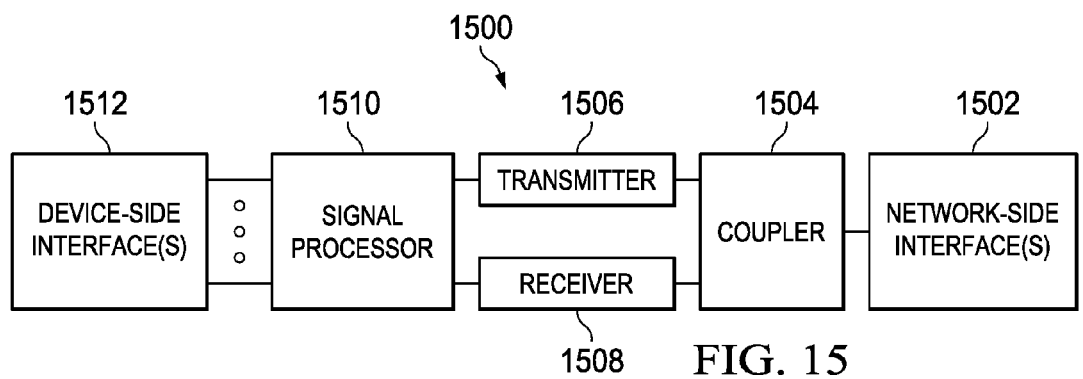
FIG. 15 illustrates a block diagram of an embodiment a transceiver.

In some embodiments, one or more of the interfaces 1410, 1412, 1414 connects the processing system 1400 to a transceiver adapted to transmit and receive signaling over the telecommunications network. FIG. 15 illustrates a block diagram of a transceiver 1500 adapted to transmit and receive signaling over a telecommunications network. The transceiver 1500 may be installed in a host device. As shown, the transceiver 1500 comprises a network-side interface 1502, a coupler 1504, a transmitter 1506, a receiver 1508, a signal processor 1510, and a device-side interface 1512. The network-side interface 1502 may include any component or collection of components adapted to transmit or receive signaling over a wireless or wireline telecommunications network. The coupler 1504 may include any component or collection of components adapted to facilitate bi-directional communication over the network-side interface 1502. The transmitter 1506 may include any component or collection of components (e.g., up-converter, power amplifier, etc.) adapted to convert a baseband signal into a modulated carrier signal suitable for transmission over the network-side interface 1502. The receiver 1508 may include any component or collection of components (e.g., down-converter, low noise amplifier, etc.) adapted to convert a carrier signal received over the network-side interface 1502 into a baseband signal. The signal processor 1510 may include any component or collection of components adapted to convert a baseband signal into a data signal suitable for communication over the device-side interface(s) 1512, or vice-versa. The device-side interface(s) 1512 may include any component or collection of components adapted to communicate data-signals between the signal processor 1510 and components within the host device (e.g., the processing system 1400, local area network (LAN) ports, etc.).

The transceiver 1500 may transmit and receive signaling over any type of communications medium. In some embodiments, the transceiver 1500 transmits and receives signaling over a wireless medium. For example, the transceiver 1500 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 1502 comprises one or more antenna/radiating elements. For example, the network-side interface 1502 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 1500 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Those skilled in the art will appreciate that although the above description has been addressed to a mechanism for reducing the complexity of a decoding making use of a belief propagating message passing algorithm, it should be appreciate that an expectation propagating message passing algorithm can be similarly implemented. The ability to prune an alphabet based on likelihoods and APP values can also be used to reduce the complexity of an MPA processor that is relying upon expectation propagation. Extreme expectation values can be identified and used to prune the codewords in an possible decoding alphabet to allow for a complexity reduction.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method comprising:
   receiving, by a Message Passing Algorithm (MPA) processor, a sequence of samples representative of a received signal from a device;
   receiving, or otherwise generating, one or more probabilities associated codewords of a codebook assigned to a data stream in the received signal, wherein each codeword in the codebook represents a different spreading sequence;
   removing, in accordance with the one or more probabilities, at least one of the codewords from the codebook to obtain a pruned codebook, the pruned codebook excluding the at least one codeword;
   processing, by the MPA processor, the sequence of samples according to the pruned codebook to generate soft decision values corresponding to the received signal; and
   sending the soft decision values to a forward error correction (FEC) decoder for use in bit-level decoding of the received signal.

2. The method of claim 1, wherein processing the sequence of samples comprises:

exchanging belief propagation messages for codewords remaining in the pruned codebook between nodes of the MPA processor during a set of MPA iterations without exchanging belief propagation messages for the at least one codeword excluded from the pruned codebook during the set of MPA iterations; and generating the soft decision values based on the sequence of samples and the exchanged belief propagation messages.

3. The method of claim 1, wherein the one or more probabilities indicate likelihoods that one or more codewords in the codebook are carried in the data stream.

4. The method of claim 3, wherein removing the at least one codeword from the codebook to obtain the pruned codebook comprises:

removing, from the codebook, any codewords whose likelihood of being carried in the data stream is less than a probability threshold.

5. The method of claim 4, wherein the probability threshold is predetermined.

6. The method of claim 4, wherein the probability threshold is based on the relative probabilities of codewords in the codebook.

7. The method of claim 1, wherein removing the at least one codeword from the codebook to obtain the pruned codebook comprises:

determining that a likelihood of a given bit in a given modulated symbol having a given binary value exceeds a threshold; and removing, from the codebook, any codewords that map the given bit in the given modulated symbol to a different binary value.

8. The method of claim 7, wherein determining that the likelihood of the given bit having the given binary value exceeds the threshold comprises determining that an LLR magnitude associated with the given binary value exceeds the threshold.

9. The method of claim 8, wherein the threshold is predetermined.

10. The method of claim 8, wherein the threshold is dynamically set based on the values of other LLRs in the modulated symbol, the given layer of the received signal, or the received signal.

11. The method of claim 1, wherein the one or more probabilities are Log Likelihood Ratios (LLRs) indicative of a sign bit for a given binary bit in the data stream and a set of magnitude bits indicating a confidence level in the accuracy of the sign bit.

12. The method of claim 11, wherein the LLR is received from the FEC decoder.

13. The method of claim 1, wherein the one or more probabilities are a priori probability (APP) values indicative of the likelihood of a given codeword having been transmitted.

14. The method of claim 1, wherein receiving the one or more probabilities comprises receiving feedback information including the one or more probabilities.

15. The method of claim 1, wherein processing the sequence of samples according to the pruned codebook to generate soft decision values corresponding to the received signal comprises:

receiving, by a function node of the MPA processor, messages corresponding to codewords remaining in the pruned codebook from variable nodes in the MPA processor without receiving, from the variable nodes, any messages corresponding to the at least one codeword excluded from the pruned codebook; and distributing the received messages among the variable nodes.

16. The method of claim 1, wherein processing the sequence of samples according to the pruned codebook to generate soft decision values corresponding to the received signal comprises:

receiving, by a variable node of the MPA processor, information about the received signal from function nodes of the MPA processor; and calculating, based on the information, probabilities that codewords remaining in the pruned codebook were transmitted in the data stream without calculating probabilities that the at least one codeword excluded from the pruned codebook was transmitted in the data stream.

17. The method of claim 1, wherein the step of processing the sequence of samples comprises generating a computation schedule to exclude operations associated with messages related to codewords pruned from the alphabet.

18. A decoder comprising:
a forward error correction (FEC) decoder; and
a message passing algorithm (MPA) processor coupled to the FEC decoder, the MPA processor configured to receive a sequence of samples representative of a received signal from a device, to receive, or otherwise obtain, one or more probabilities associated codewords of a codebook assigned to a data stream in the received signal, to remove, in accordance with the one or more probabilities, at least one of the codewords from the codebook to obtain a pruned codebook, the pruned codebook excluding the at least one codeword, to process the sequence of samples according to the pruned codebook to generate soft decision values corresponding to the received signal, and to send the soft decision values to a forward error correction (FEC) decoder for use in bit-level decoding of the received signal, wherein each codeword in the codebook represents a different spreading sequence.

19. The decoder of claim 18, wherein the one or more probabilities include a codeword probability, an a priori probability (APP) value, or a log likelihood ratio (LLR).

20. A computer program product comprising a computer readable storage medium storing programming, the programming including instructions to:

receive, at a Message Passing Algorithm (MPA) processor a sequence of samples representative of a received signal from a device;

receive, or otherwise obtain, one or more probabilities associated codewords of a codebook assigned to a data stream in the received signal, wherein each codeword in the codebook represents a different spreading sequence;

remove, in accordance with the one or more probabilities, at least one of the codewords from the codebook to obtain a pruned codebook, the pruned codebook excluding the at least one codeword;

process, at the MPA processor, the sequence of samples according to the pruned codebook to generate soft decision values corresponding to the received signal; and send the soft decision values to a forward error correction (FEC) decoder for use in bit-level decoding of the received signal.

* * * * *